United States Patent
Hwang et al.

(10) Patent No.: US 8,637,776 B2
(45) Date of Patent: Jan. 28, 2014

(54) CONDUCTIVE PATTERN AND MANUFACTURING METHOD THEREOF

(75) Inventors: Ji-Young Hwang, Daejeon (KR);
In-Seok Hwang, Daejeon (KR);
Dong-Wook Lee, Daejeon (KR);
Min-Choon Park, Daejeon (KR);
Seung-Heon Lee, Daejeon (KR);
Sang-Ki Chun, Daejeon (KR);
Yong-Koo Son, Daejeon (KR);
Beom-Mo Koo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 56 days.

(21) Appl. No.: 13/148,251

(22) PCT Filed: Feb. 8, 2010

(86) PCT No.: PCT/KR2010/000763
§ 371 (c)(1),
(2), (4) Date: Oct. 21, 2011

(87) PCT Pub. No.: WO2010/090488
PCT Pub. Date: Aug. 12, 2010

(65) Prior Publication Data
US 2012/0031647 A1  Feb. 9, 2012

(30) Foreign Application Priority Data

Feb. 6, 2009 (KR) .................. 10-2009-0009750
Dec. 21, 2009 (KR) .................. 10-2009-0127756

(51) Int. Cl.
*H05K 1/00* (2006.01)
*H05K 1/09* (2006.01)
*H05K 1/03* (2006.01)

(52) U.S. Cl.
USPC ....................... 174/250; 174/257; 174/255

(58) Field of Classification Search
USPC ................ 174/250, 255, 257; 361/777–779
See application file for complete search history.

(56) References Cited

U.S. PATENT DOCUMENTS 5,614,728 A * 3/1997 Akiyama ................... 257/57
5,821,622 A * 10/1998 Tsuji et al. ................ 257/763
(Continued)

FOREIGN PATENT DOCUMENTS

CN  1236505 A  11/1999
CN  1381860 A  11/2002
(Continued)

OTHER PUBLICATIONS

Printed Circuits Handbook, Sixth Edition, Clyde F. Coombs, Jr, 2008, McGraw-Hill, ISBN: 978-0-07-146734-6, p. 34.22-34.25.

(Continued)

*Primary Examiner* — Hoa C Nguyen
*Assistant Examiner* — Ahmad D Barnes
(74) *Attorney, Agent, or Firm* — McKenna, Long & Aldridge, LLP

(57) ABSTRACT

The present invention provides a method for manufacturing a conductive pattern, comprising the steps of: a) forming a conductive film on a substrate; b) forming an etching resist pattern on the conductive film; and c) forming a conductive pattern having a smaller line width than a width of the etching resist pattern by over-etching the conductive film by using the etching resist pattern, and a conductive pattern manufactured by using the same. According to the exemplary embodiment of the present invention, it is possible to effectively and economically provide a conductive pattern having a ultrafine line width.

10 Claims, 10 Drawing Sheets

(56) References Cited

U.S. PATENT DOCUMENTS

| | | |
|---|---|---|
| 6,204,520 B1 | 3/2001 | Ha et al. |
| 6,356,336 B2 * | 3/2002 | Maeda .......................... 349/187 |
| 1,236,505 A1 | 4/2002 | Takagi et al. |
| 6,541,389 B1 | 4/2003 | Kubo et al. |
| 7,396,765 B2 | 7/2008 | Lee et al. |
| 2001/0007362 A1 | 7/2001 | Ha et al. |
| 2003/0017422 A1 | 1/2003 | Yamaguchi |
| 2003/0026959 A1 | 2/2003 | Furuse et al. |
| 2003/0052078 A1 | 3/2003 | Sakayori et al. |
| 2005/0158639 A1 | 7/2005 | Yamaguchi et al. |
| 2007/0031140 A1 | 2/2007 | Biernath et al. |
| 2007/0097278 A1 | 5/2007 | Rho et al. |
| 2009/0029127 A1 | 1/2009 | Watanabe et al. |
| 2009/0133922 A1 | 5/2009 | Okazaki et al. |
| 2010/0206628 A1 | 8/2010 | Matsui et al. |
| 2010/0244666 A1 | 9/2010 | Tanaka |

FOREIGN PATENT DOCUMENTS

| | | |
|---|---|---|
| CN | 1622699 A | 6/2005 |
| CN | 1975517 A | 6/2007 |
| CN | 101034262 A | 9/2007 |
| CN | 101189930 A | 5/2008 |
| EP | 0127794 | 12/1984 |
| EP | 0127794 A2 | 12/1984 |
| JP | 1976-097770 A | 8/1976 |
| JP | 1980-6833 A | 1/1980 |
| JP | 1993-054326 A | 3/1993 |
| JP | 1998-200234 A | 7/1998 |
| JP | 2000-188277 A | 7/2000 |
| JP | 2000315683 | 11/2000 |
| JP | 2000315890 A | 11/2000 |
| JP | 2001-077098 A | 3/2001 |
| JP | 2002-093316 A | 3/2002 |
| JP | 2003-069188 A | 3/2003 |
| JP | 2006344163 A | 12/2006 |
| JP | 2008009921 A | 1/2008 |
| JP | 2008-084837 | 4/2008 |
| JP | 2008083497 A | 4/2008 |
| JP | 2008134975 A | 6/2008 |
| JP | 2008-251822 A | 10/2008 |
| JP | 2009009249 A | 1/2009 |
| KR | 10-1999-0013298 | 2/1999 |
| KR | 10-2002-0082420 | 10/2002 |
| KR | 100442556 B1 | 7/2004 |
| KR | 10-2006-0045260 | 5/2006 |
| KR | 10-2006-0060795 A | 6/2006 |
| KR | 2008-0042111 A | 5/2008 |
| TW | 493285 B | 7/2002 |
| TW | 200818981 A | 4/2008 |
| WO | WO 2006/088059 | 8/2006 |
| WO | WO 2006/088059 A1 | 8/2006 |
| WO | 2008-029776 A1 | 3/2008 |

OTHER PUBLICATIONS

Office Action of Chinese Patent Office in Application No. 201080007007.6, dated Apr. 24, 2013.

Office Action of Japanese Patent Office in Application No. 2012-520547, dated Apr. 2, 2013.

* cited by examiner

Line edge
roughness (LER)
=Max from left +
  Max from right)

Limitation of etching
> 2LER
=critical line width

CONDUCTIVE PATTERN AND MANUFACTURING METHOD THEREOF

This application is a national stage application of PCT/KR/2010/000763, filed Feb. 8, 2010, which claims priority from Korean Patent Application Nos. 10-2009-0009750, and 10-2009-0127756, filed on Feb. 6, 2009 and Dec. 21, 2009 in the Korean Intellectual Property Office, respectively, all of which are incorporated herein by reference in their entirety.

TECHNICAL FIELD

The present invention relates to a conductive pattern and a method for manufacturing the same.

BACKGROUND ART

Conductive parts such as electrodes are used in electronic diodes such as a touch screen, a display, and a semiconductor. Currently, as transparency is needed for various electronic diodes, the conductive parts are required to have excellent conductivity and invisibility. In particular, in the touch screen, sensitivity to touch and recognition of multi-touch are required more and more, and development of the conductive parts that can implement this performance is required.

The conductive parts may be formed in a conductive pattern or a transparent conductive film form. However, in the case where the conductive part is formed in the conductive pattern form, there is a limit in forming the thin line width of the conductive pattern by a known printing method, and a photolithography method uses an expensive device when forming the thin line width of the conductive pattern, such that there is a disadvantage in that a cost is high. Accordingly, the conductive parts are formed in a transparent conductive film form so that the conductive parts are invisible.

For example, in general, a touch screen uses an ITO-based conductive film by patterning the conductive film, but when this ITO is applied to a large area touch screen, there is a problem in that a recognition speed is low due to a RC delay by a self high resistance value. In order to overcome this problem, many companies are developing technologies for replacing the ITO by using a printing manner, but these technologies have a disadvantage in that it is difficult to manufacture an invisible ultrafine pattern in terms of visibility.

DISCLOSURE

Technical Problem

The present invention has been made in an effort to provide a method for economically manufacturing a conductive pattern having a ultrafine line width in a large size, and a conductive pattern having a ultrafine line width formed by using the same.

Technical Solution

An exemplary embodiment of the present invention provides a method for manufacturing a conductive pattern, comprising the steps of:
a) forming a conductive film on a substrate;
b) forming an etching resist pattern on the conductive film; and
c) forming a conductive pattern having a smaller line width than a width of the etching resist pattern by over-etching the conductive film by using the etching resist pattern.

The method for manufacturing a conductive pattern according to the exemplary embodiment of the present invention may further comprise the step of d) removing the etching resist pattern.

Another exemplary embodiment of the present invention provides a conductive pattern in which a line width is 100 micrometers or less, preferably 0.1 to 30 micrometers, more preferably 0.5 to 10 micrometers, and more preferably 1 to 5 micrometers. The conductive pattern according to the exemplary embodiment of the present invention may further comprise an insulation layer pattern that is disposed on the conductive pattern, has a pattern corresponding to the conductive pattern, and has a longer line width than the line width of the conductive pattern. The conductive pattern according to the exemplary embodiment of the present invention may be manufactured by the above method.

Advantageous Effects

According to exemplary embodiments of the present invention, it is possible to very economically provide a conductive pattern having a more fine line width and to form the conductive pattern having the fine line width without connection traces in a large size by using an over-etching method as compared to a known method for forming a conductive pattern. In addition, according to exemplary embodiments of the present invention, it is possible to provide a conductive pattern having a ultrafine line width that cannot be easily implemented by a known method.

BEST MODE

Hereinafter, the present invention will be described in more detail.

A method for manufacturing a conductive pattern according to an exemplary embodiment of the present invention comprises the steps of a) forming a conductive film on a substrate; b) forming an etching resist pattern on the conductive film; and c) forming a conductive pattern having a smaller line width than a width of the etching resist pattern by over-etching the conductive film by using the etching resist pattern.

In the present specification, over-etching means that the conductive film is etched so as to have a smaller line width than a line width of the etching resist pattern.

Figure 1:
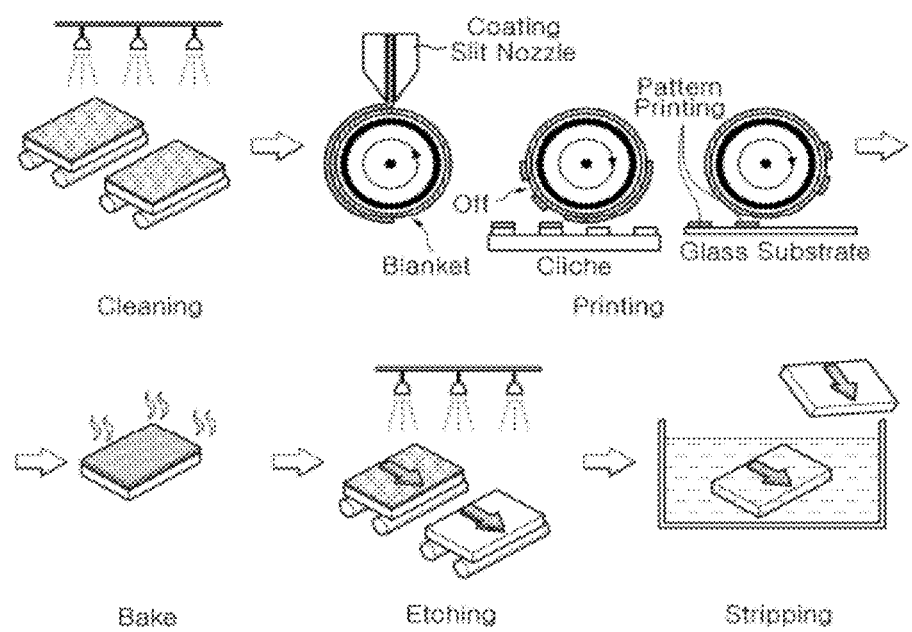
FIGS. 1 to 3 illustrate exemplary embodiments of a method of the present invention.
Figure 2:
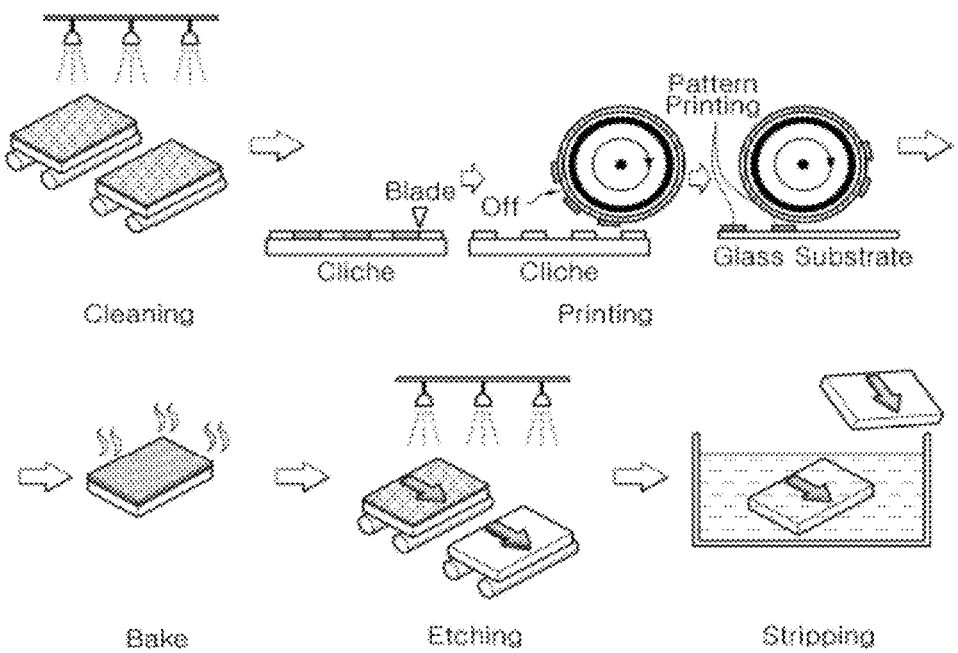

The method for manufacturing a conductive pattern according to the exemplary embodiment of the present invention may further comprise the step of d) removing the etching resist pattern. An example using the step d) is illustrated in FIGS. 1 and 2, but the scope of the present invention is not limited to processes shown in the drawings, and if necessary, a portion of the processes shown in FIGS. 1 and 2 may be omitted or added.

The material of the substrate may be appropriately selected according to the field desired to apply the manufacturing method of the conductive pattern according to the exemplary embodiment of the present invention, and as preferable examples thereof, there are a glass or an inorganic material substrate, a plastic substrate or other flexible substrate, but the material is not limited thereto.

The material of the conductive film is not particularly limited, but it is preferable that the material is a metal film. As a detailed example of the material of the conductive film, a single film or a multilayered film comprising silver, aluminum, copper, neodimium, molybdenum or an alloy thereof is preferable. Herein, the thickness of the conductive film is not particularly limited, but is preferably 0.01 to 10 μm in terms of the conductivity of the conductive layer and the economic efficiency of the forming process thereof.

The method for forming the conductive film is not particularly limited, and may use methods such as deposition, sputtering, wet coating, vaporization, electroplating, electroless plating, and lamination of a metal thin film. According to the exemplary embodiment of the present invention, there are advantages in that a conductive pattern comprised in an effective screen part of an electronic part for display and a wire part for applying a signal thereto may be simultaneously formed. In particular, the method for forming the conductive film may use a method where organic metal, nano metal or a complex solution thereof is coated on the substrate, and then conductivity is provided by firing and/or drying. As the organic metal, organic silver may be used, and as the nano metal, nano silver particles may be used.

In the exemplary embodiment of the present invention, before the conductive film is formed, a buffer layer for providing adhesion strength may be further formed on the substrate.

The method according to the exemplary embodiment of the present invention may further comprise a washing the step after the step a).

Figure 5:
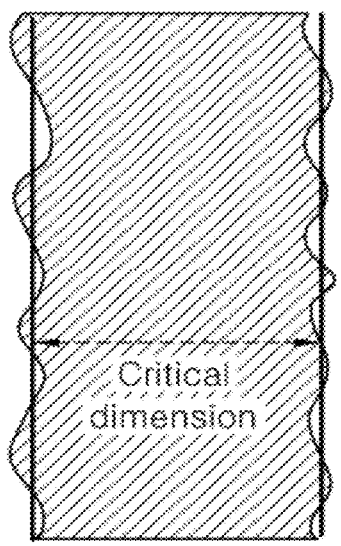
FIG. 5 schematizes critical dimensions of a line edge roughness of the conductive pattern and a minimum line width of the conductive pattern according thereto.
Figure 6:
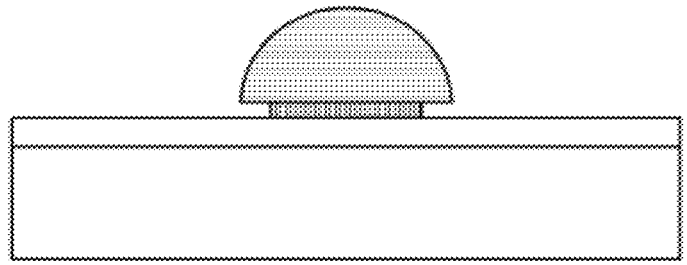
FIGS. 6 to 9 illustrate a cross-section of a structure in the case where an upper surface of the conductive pattern according to the exemplary embodiment of the present invention is provided with an etching resist pattern.
Figure 7:
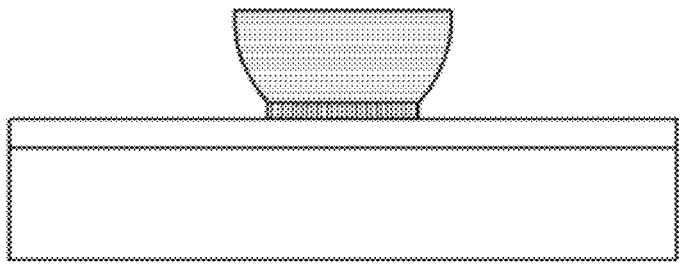
Figure 8:
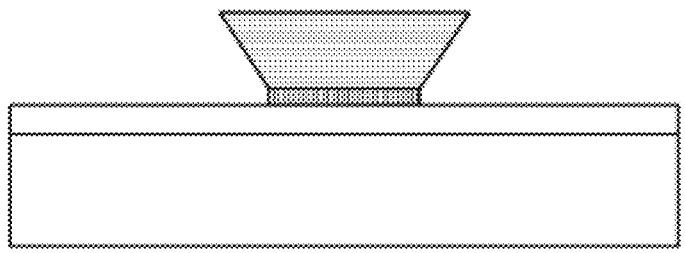
Figure 9:
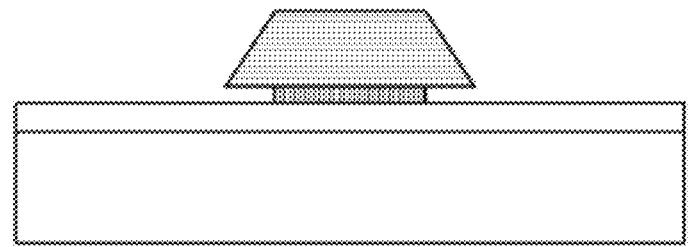

The present inventors found that a line edge roughness (LER) of the etching resist pattern formed in the step b) determines a critical dimension of a minimum line width of the conductive pattern that may be formed without a short circuit by over-etching. In the case where the line edge roughness (LER) of the etching resist pattern is too large, before the desired conductive pattern of the line width when the over-etching is performed, the conductive pattern may be short-circuited. The line edge roughness (LER) of the etching resist pattern may be ½ of the minimum line width of the conductive pattern. Therefore, the line edge roughness (LER) of the etching resist pattern may be controlled to ½ or less of the line width of the desired conductive pattern. Therefore, the line edge roughness (LER) of the etching resist pattern is preferably 0.1 to 5 micrometers, and more preferably 0.2 to 5 micrometers. In the case where the edge roughness is in the range, it is advantageous to form the conductive pattern having the ultrafine line width of 10 micrometers, and preferably 5 micrometers or less. Herein, the line edge roughness (LER) means the height of the most protruding point on the basis of the deepest point of the line edge of the etching resist pattern. FIG. 5 illustrates the line edge roughness of the etching resist pattern.

In the step b), the method for forming the etching resist pattern is preferably a printing method, a photolithography method, a photography method, a method using a mask, or laser transferring, for example, thermal transfer imaging, and more preferably, a printing method or a photolithography method.

The printing method may be performed in such a way that the paste or ink comprising the etching resist material is transferred on the substrate on which the conductive film is formed in a desired pattern form and then fired. The transferring method is not particularly limited, but the above pattern is formed on the pattern transferring medium such as a intaglio printing plate or a screen and the desired pattern may be transferred on the conductive film by using this. The method for forming the pattern form on the pattern transferring medium may be performed by using the method that is known in the art.

The printing method is not particularly limited, printing methods such as gravure offset printing, reverse offset printing, screen printing, and gravure printing may be used, and in particular, gravure offset printing or reverse offset printing is more preferable in order to obtain the conductive pattern having the ultrafine line width by forming the etching resist pattern in the range of the line edge roughness (LER) described above.

Figure 3:
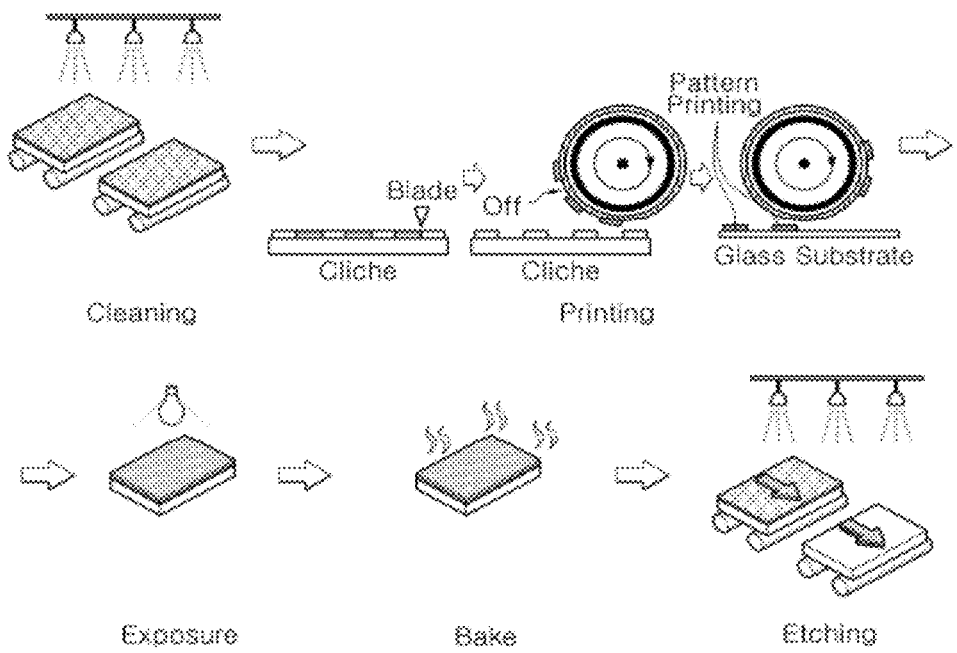

The reverse offset printing may be performed by coating a paste on a roll type blanket, attaching the paste to a cliché having unevenness, so that a desired pattern is formed on the blanket, and transferring the pattern formed on the blanket on a conductive film. This printing method is illustrated in FIG. 1. The gravure offset printing may be performed by using the method in which after the paste is filled in the intaglio printing plate on which the pattern is formed, the primary transferring is performed by using silicon rubber called the blanket, and the secondary transferring is performed by closely contacting the blanket and the substrate on which the conductive film is formed. This printing method is illustrated in FIGS. 2 and 3. However, FIGS. 1 to 3 illustrate a method for implementing the exemplary embodiment of the present invention, but the scope of the exemplary embodiment of the present invention is not limited thereby. If necessary, among the processes described in FIGS. 1 to 3, some processes may be omitted or added.

In the case of the gravure offset printing method or reverse offset printing method, because of the release property of the blanket, most of the ink or paste is transferred on the substrate on which the conductive film is formed, such that a separate blanket washing process is not required. The intaglio printing plate may be manufactured by precisely etching the substrate. The intaglio printing plate may be manufactured by etching a metal plate, or may be manufactured through optical patterning using a polymer resin.

The screen printing may be performed by using the method in which after the paste is disposed on the screen on which the pattern is formed, the paste is directly provided on the board on which the conductive film is formed through the screen with an empty space while the squeeze is pushed. The gravure printing may be performed by using the method in which after the paste is filled in the pattern while the blanket where the pattern is formed on the roll is wound, the paste is transferred on the substrate on which the conductive film is formed. In the exemplary embodiment of the present invention, the above methods may be used alone or in a combination. In addition, other printing methods that are known to the person with ordinary skill in the art may be used.

In the exemplary embodiment of the present invention, it is preferable that the printing method is used, and among them, it is preferable that the offset printing method, reverse offset printing method or gravure printing method is used.

In the case where the reverse offset printing method is used, the viscosity of the ink for printing comprising the material of the etching resist pattern is preferably 0 cps to 1,000 cps, and more preferably 5 cps to 10 cps. In addition, in the case where the gravure printing method is used, the viscosity of the ink is preferably 6,000 cps to 12,000 cps, and more preferably 7,000 cps to 8,000 cps. When the viscosity of ink is in the above range, coating of ink may be appropriately performed and stability of ink (process maintaining ability of ink) may be maintained during the process, in each printing method.

In the exemplary embodiment of the present invention, the method for forming the etching resist pattern is not limited to the above printing method, and the photolithography method may be used. For example, a method for forming a resist layer having the photosensitivity and acid resistance (resistance to etching) on a conductive film and patterning the layer by selective exposure and developing may be used.

The etching resist pattern is not particularly limited, but it is preferable that a taper angle is 0 to 90°.

It is preferable that the etching resist pattern is formed by using a material having acid resistance not reacting with the etching solution used when the conductive film is etched, and sufficient adhesion strength to the conductive film. Furthermore, it is preferable that the material of the etching resist pattern has an insulation property. It is preferable that the etching resist material has an insulation property of a leakage current of $10^{-1}$ ampere or less. The leakage current of the etching resist material may be $10^{-16}$ ampere or more. It is preferable that the etching resist material has acid resistance in respect to the etching solution of the conductive film used in the corresponding method, and for example, it is preferable that there is no shape change for 10 min or more when contacting with the etching solution of the corresponding conductive film by the dipping or spray method.

In detail, as the material of the etching resist, a plastic or setting polymer material may be used. In the exemplary embodiment of the present invention, as the etching resist material, a thermosetting resin and a UV curable resin may be used. Since the UV curable resin may not use a solvent unlike the thermosetting resin, there is no problem according to vaporization of the solvent, such that the UV curable resin is advantageous in formation of a stable type of fine pattern. FIG. 3 illustrates the case where an etching resist pattern is manufactured by using the UV curable resin.

In detail, as an example of the etching resist material, imide-based polymer, bisphenol-based polymer, epoxy-based polymer, acryl-based polymer, ester-based polymer, novolac-based polymer; or a combination thereof may be used. Among them, the acryl-based, imide-based, or novolac-based resin is preferable. In addition, as an example of the etching resist material, a combination or copolymer of two or more selected from imide-based monomer, bisphenol-based monomer, epoxy-based monomer, acryl-based monomer, and ester-based monomer, for example, the epoxylated acryl resin or the copolymer of epoxy-based monomer and acryl-based monomer may be used.

In the case where the etching resist pattern is formed by the printing method, the process margin may be increased by controlling the solid content or appropriately selecting the solvent.

The solid content of the printing composition for forming the etching resist pattern may be variously controlled according to the kind of the printing method or the thickness of the etching resist pattern. For example, in the case of using the gravure printing method, it is preferable that the solid content of the etching resist pattern composition is in the range of 70 wt % to 80 wt %. In addition, in the case of forming the etching resist pattern having the thickness of 100 nm to 10 micrometer, and more preferably 500 nm to 2 micrometer by using the reverse offset printing method, it is preferable that the solid content of the etching resist pattern composition is in the range of 10 wt % to 25 wt %. However, the range of the exemplary embodiment of the present invention is not limited to the above examples, and the solid content of the etching resist pattern composition may be controlled by the person with ordinary skill in the art according to other materials or the process condition.

As the solvent that can be added to the etching resist pattern composition, a solvent that can be used in the art may be used, and a single kind of solvent or a mixed solvent of two or more kinds may be used. For example, the solvent is not particularly limited if a solvent does not damage a blanket material used in the printing method, for example, PDMS. For example, PGMEA (propylene glycol methyl ether acetate), ethanol, propylene carbonate, butyl cellosolve, DMAc (dimethyl acetamide), MEK (methyl ethyl ketone), and MIBK (methyl isobutyl ketone) may be used.

The composition for forming the etching resist pattern may further comprise an adhesion promoter and a surfactant.

In the step c), the conductive pattern that has the smaller line width than the line width of the etching resist pattern is formed by over-etching the etching resist pattern used as a mask.

The above etching manner may be a wet etching using the etching solution or a dry etching using plasma or laser, but is not limited thereto.

In the case where the wet etching is used, one or two or more of a nitric acid ($HNO_3$) solution, a mixed acid solution of phosphoric acid/nitric acid/acetic acid, hydrogen peroxide, perchloric acid, hydrochloric acid, hydrofluoric acid, and oxalic acid, or an aqueous solution thereof may be used as the etching solution, and if necessary, an additive and other elements for etching the desired conductive film may be added thereto, but the solution is not limited thereto, and in general, a matter that is known as the etching solution of the corresponding conductive film may be used.

In the step c), when the conductive film is etched, an undercut is formed at a lower part of an edge of the etching resist pattern by performing over-etching.

The term "undercut" means a form where when a first layer is formed on a substrate, a second layer is formed thereon, and then only the first layer is selectively etched by using the second layer as a mask, a lateral surface of the first layer is over-etched, such that an area of the first layer is narrower than an area of the second layer. Herein, the wording "using the second layer as a mask" means that the second layer is not modified or removed, but remains by the etching.

In the general etching process, in the case where the first layer is etched by using the second layer as the mask, the process aims to implement the pattern of the first layer having the same shape as the pattern of the second layer, and rejects the occurrence of the undercut.

However, in the exemplary embodiment of the present invention, it is possible to obtain the conductive pattern that has the thinner line width than the line width of the etching resist pattern by etching the conductive film so that an undercut is formed at a lower part of the etching resist pattern.

In the step c), in the case where the undercut occurs by the over-etching, the line width or the length of the etching resist pattern becomes longer than the line width or the length of the conductive pattern.

In addition, in the case where the undercut occurs, the taper angle of the conductive pattern is 0 to 90°, more preferably 0 to 45°, and more preferably 0 to 30°, but is not limited thereto. Herein, the taper angle means an angle between an end of the conductive pattern and a lower part layer thereof, that is, the surface of the substrate. The taper angle may be measured by an angle between a straight line having an average slope of tangent lines from the end point of the conductive pattern to the point at which the upper surface of the conductive pattern starts to be flat and the surface of the lower part layer thereof. In the exemplary embodiment of the present invention, it is possible to provide a conductive pattern where a taper angle is small by using the above method, unlike a known technology.

In the step c), it is possible to control the line width of the conductive pattern according to the etching time for forming the conductive pattern. The longer the etching time is, the thinner the line width of the conductive pattern is.

Figure 4:
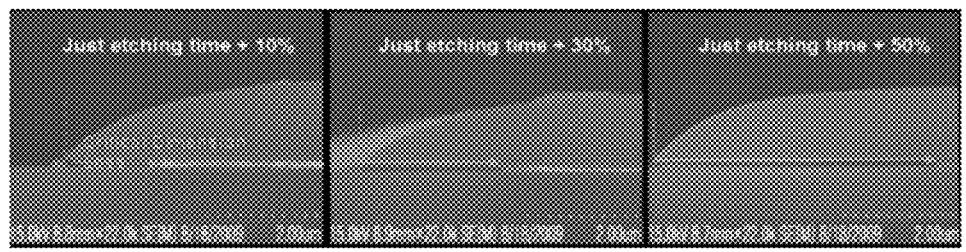
FIG. 4 is a picture that illustrates a line width of a conductive pattern according to the degree of over-etching.

In the exemplary embodiment of the present invention, the etching time for forming the conductive pattern may be changed according to conditions such as the kind or concentration of the etching solution used when the conductive pattern is formed, the kind of the conductive film, and an etching temperature. For example, it is preferable that the etching time is a just-etching time (JET) to a time that is delayed by 2,000% as compared to the just-etching time, preferably a time that is delayed by 1 to 1,000% as compared to the just-etching time, more preferably a time that is delayed by 1 to 500% as compared to the just-etching time, and even more preferably a time that is delayed by 5 to 100% as compared to the just-etching time. Herein, the just-etching time means a time required to etch the pattern to have the same shape as the mask. The line width of the conductive pattern according to the etching time is illustrated in FIG. 4.

The etching temperature of the conductive film may be also changed according to conditions such as the kind or concentration of the etching solution used when the conductive film is patterned, the kind of the conductive film, and the etching temperature, and for example, the etching may be performed at normal temperature to 80° C., and preferably 30 to 70° C.

As the etching method, a dip etching method or a spray method may be feasible, but the spray method is more preferable for uniform etching.

In the case where the conductive film is a multilayered film, it is preferable that the etching solution is used so that the multilayered films are simultaneously etched at almost the same rate.

After the conductive film is etched by using the etching resist pattern as the mask, the etching resist pattern may be removed, but may be used in electronic diodes while the etching resist pattern is not removed.

In the step d), the etching resist pattern may be removed by using a method that is known in the art according to a kind of a material of the etching resist pattern.

In the exemplary embodiment of the present invention, it is preferable that a bake process is performed during or after the step b) for forming the etching resist pattern (FIGS. 1 and 2). In detail, it is preferable that the bake process is performed after the etching resist layer is formed on the substrate and after the etching resist pattern is formed during the step b), or before the conductive pattern is formed in the step c). The bake means that adhesion strength is provided between the etching resist pattern and the adjacent layer and at least a portion of the etching resist pattern is cured, and by this, it is possible to prevent the deformation of the etching resist pattern in the bake step or the subsequent step. The degree of curing of the etching resist pattern to be accomplished by the bake process may be determined by the person with ordinary skill in the art according to the material of the etching resist pattern or the process condition, and for example, the degree of curing may be in the range of 0 to 100%.

The condition of the bake process may be selected by the person with ordinary skill in the art according to the material of the etching resist pattern, the thickness of the etching resist pattern, the etching condition used in forming the conductive pattern, for example, the kind of etching solution, the etching time, and the etching temperature. If the bake temperature is too high, the degree of crosslinking of the etching resist pattern is too high, such that deformation, for example, distortion of the pattern region may occur.

As an example thereof, it is preferable that in the case where the etching resist pattern is formed by using the novolac-based polymer by the photolithography method, the bake is performed at a temperature of 80 to 150° C. for 2 min to 3 min. As another example thereof, it is preferable that in the case where the etching resist pattern is formed by using the novolac-based polymer by the printing method, the bake is performed at a temperature of 125 to 130° C. for 2 min to 3 min. As still another example thereof, it is preferable that in the case where the etching resist pattern is formed by using the acryl-based polymer, the bake is performed at a temperature of 170 to 230° C. for 5 min to 60 min. As yet another example thereof, it is preferable that in the case where the etching resist pattern is formed by using the PSPI polymer, the bake is performed at a temperature of 120 to 300° C. for 1 min to 60 min.

In the case where the bake temperature is too low, it is difficult to obtain a crosslinking effect according to performance of the bake, and in the case where the bake temperature is too high, the shape may be deformed due to the distortion of the etching resist pattern. The bake time varies according to the above-mentioned material or the process condition, and for example, the bake may be performed for 2 to 3 min, but the time is not limited thereto.

In the exemplary embodiment of the present invention, as the material of the etching resist pattern, in the case where the UV curable resin is used, exposure or firing may be performed during or after the step b). This example is illustrated in FIG. 3.

The method according to the exemplary embodiment of the present invention method may further comprise a washing step after the step c) or the step d). In this washing step, the etching solution used in the step c) may be used. Foreign material may be removed by performing the washing step.

Another exemplary embodiment of the present invention provides a conductive pattern in which a line width is 100 micrometers or less, preferably 0.1 to 30 micrometers, more preferably 0.5 to 10 micrometers, and more preferably 1 to 5 micrometers.

The conductive pattern according to the exemplary embodiment of the present invention may further comprise an etching resist pattern that is disposed on the conductive pattern, has a pattern corresponding to the conductive pattern, and has a longer line width than the line width of the conductive pattern. After this structure may be manufactured by forming the conductive pattern according to the above method and not removing the etching resist pattern used as the mask in order to form the conductive pattern. In this case, it is preferable that the etching resist pattern has an insulation property.

In the case where the etching resist pattern is provided on the conductive pattern, it is possible to provide an additional optical characteristic through controlling a kind of a material of the etching resist pattern and a three dimensional shape thereof. The structure in which the etching resist pattern that has the longer line width than the line width of the conductive pattern is provided on the conductive pattern according to the exemplary embodiment of the present invention is illustrated in FIGS. 6 to 9. However, the structure is not limited to only the structure illustrated in the drawings, but may have another structure or the etching resist pattern may be removed.

Figure 10:
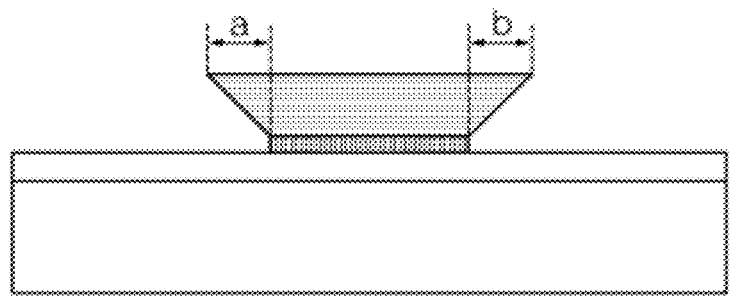
FIGS. 10 and 11 illustrate that the etching resist pattern provided on the upper surface of the conductive pattern according to the exemplary embodiment of the present invention is disposed in a symmetric structure.
Figure 11:
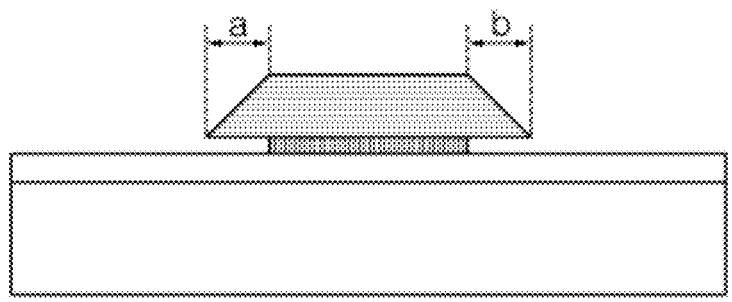

As described above, in the case where the etching resist pattern is provided on the conductive pattern, in a cross-section of the conductive pattern in a line width direction, a percentage ratio (a/b*100) of a distance (a) from an end of a side of the conductive pattern to an end of the insulation layer pattern and a distance (b) from an end of the other side of the conductive pattern to the end of the insulation layer pattern may be in the range of 90 to 110. The percentage ratio is preferably 95 to 105, and more preferably 99 to 101. In the method according to the exemplary embodiment of the present invention, the insulation layer pattern and the conductive pattern are not formed by using a separate mask or by using a separate printing method, but the conductive pattern is formed by over-etching, using the insulation layer pattern, such that the insulation layer pattern disposed on the conductive pattern may exist in a symmetric structure in respect to the conductive pattern. The symmetric structure is shown in FIGS. 10 and 11, but the scope of the present invention is not limited to the above structure. The conductive pattern according to the exemplary embodiment of the present invention may be manufactured by the above method.

The conductive pattern according to the exemplary embodiment of the present invention may be regular or irregular. The pitch of the regular pattern may be several micrometers to 2,000 micrometers, preferably 500 micrometers or less, and more preferably 250 micrometers or less.

It is preferable that the surface resistance of the conductive pattern is 100 ohm/square to 0.001 ohm/square.

The thickness of the conductive pattern according to the exemplary embodiment of the present invention is preferably 10 micrometers or less, more preferably 300 nm or less, and much more preferably 100 to 300 nm. The specific resistance value may be determined according to the kind of constitution material of the conductive pattern, and the surface resistance value may be controlled according to the thickness of the conductive pattern. In the exemplary embodiment of the present invention, as described above, since a method for forming the conductive pattern is used by using the etching resist pattern as a mask, it is possible to obtain a conductive pattern having a thin thickness as compared to the case where the conductive pattern is directly printed.

It is preferable that the conductive pattern according to the exemplary embodiment of the present invention has an opening ratio of 85% to 98%, a surface resistance of 1 ohm to 200 ohm, a thickness of 100 to 300 nm, and a line width of 0.1 to 10 micrometers, and satisfies the following Equation 1.

$$a/(1-\text{opening ratio})=A \quad \text{[Equation 1]}$$

In Equation 1, a is a surface resistance of a layer formed of a material constituting the conductive pattern in a thickness of t, and A is a surface resistance of the conductive pattern in a thickness of t.

It is preferable that the conductive pattern according to the exemplary embodiment of the present invention satisfies the following Equations 2 and 3.

$$a/[1-(R-L)^2/R^2]=A \quad \text{[Equation 2]}$$

$$(R-L)^2/R^2 \times Ts = Tc \quad \text{[Equation 3]}$$

In Equations 2 and 3,
R is a pitch of the conductive pattern,
L is a line width of the conductive pattern,
a is a surface resistance of a layer formed of a material constituting the conductive pattern in a thickness of t,
A is a surface resistance of the conductive pattern in a thickness of t,
Ts is a transmittance of the substrate, and
Tc is a transmittance of the substrate having the conductive pattern.

In the present specification, an opening ratio means a ratio of an area in which the conductive pattern is not formed on a front surface of a laminated body, and the transmittance means a transmittance ratio of light shown when visible rays pass through the substrate.

The thickness deviation of the conductive pattern according to the exemplary embodiment of the present invention according to the position thereof is preferably within 3% and more preferably within 2%. The line width deviation of the conductive pattern according to the exemplary embodiment of the present invention according to the position thereof is preferably within 30% and more preferably within 20%. In the exemplary embodiment of the present invention, when the conductive pattern is formed, it is possible to decrease the deviation of the thickness and/or the line width of the conductive pattern by using the etching resist pattern as the mask, as compared to a known technology for forming a pattern by directly printing a conductive ink or paste.

The conductive pattern according to the exemplary embodiment of the present invention has a pattern shape that is continuously formed in an area of preferably 7 inch or more and preferably 10 to 50 inch. Herein, the continuously formed pattern shape means that there are no connection traces. In the exemplary embodiment of the present invention, it is possible to form the conductive pattern having the ultrafine line width in a large area without connection traces by using the above over-etching method. The conductive pattern having the ultrafine line width in the large area cannot be implemented by a known technology. The connection trace is a trace for implementing a large are by connecting the conductive patterns that are manufactured in a small area, and for example, a method for connecting the conductive patterns having the small area by using the pad part may be used. In this case, the transmittance is preferably 85% to 98%, and the conductivity is preferably 0.1 ohm to 100 ohm. This is a design numerical value for preventing attachment from being largely recognized when electronic devices using the patterns are attached to electronic diodes such as displays while ensuring the minimum electric conductivity.

The conductive pattern according to the exemplary embodiment of the present invention may be used without limitation for the purpose of requiring the conductive pattern. For example, the pattern may be used as an electrode of an electronic diode or a lighting. Examples of the electronic element include a touch screen, a display, a semiconductor, and the like.

Hereinafter, the present invention will be exemplified through Examples. However, the following Examples are set forth to illustrate the present invention, but the scope of the present invention is not limited thereto.

EXAMPLE

Example 1

The glass substrate was manufactured by depositing the MoTi alloy on 0.5 t glass in the thickness of 30 nm, Cu thereon in the thickness of 200 nm, and Mo thereon in the thickness of 30 nm by the sputtering process.

Thereafter, the etching resist ink (novolac resin composition (commercial name LG412DF manufactured by LG Chem, Ltd. in Korea)) was printed by using the cliché having the size of line width 8 microns/pitch 200 microns and the Bouronoi irregular pattern by using the reverse offset printing. Thereafter, the bake process of the printed sample was performed at 130° C. for 3 min.

Figure 12:
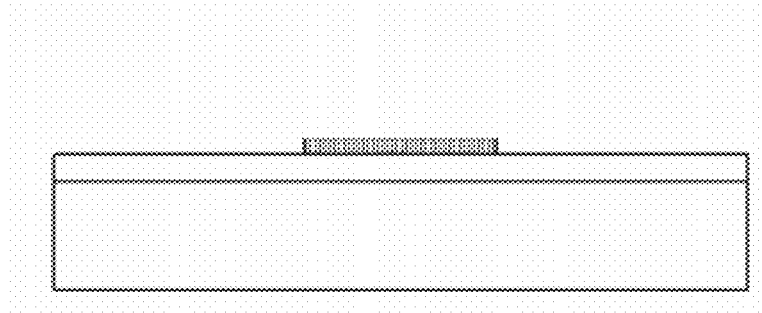
FIGS. 12 to 14 illustrate the conductive pattern manufactured in Example 1.
Figure 13:
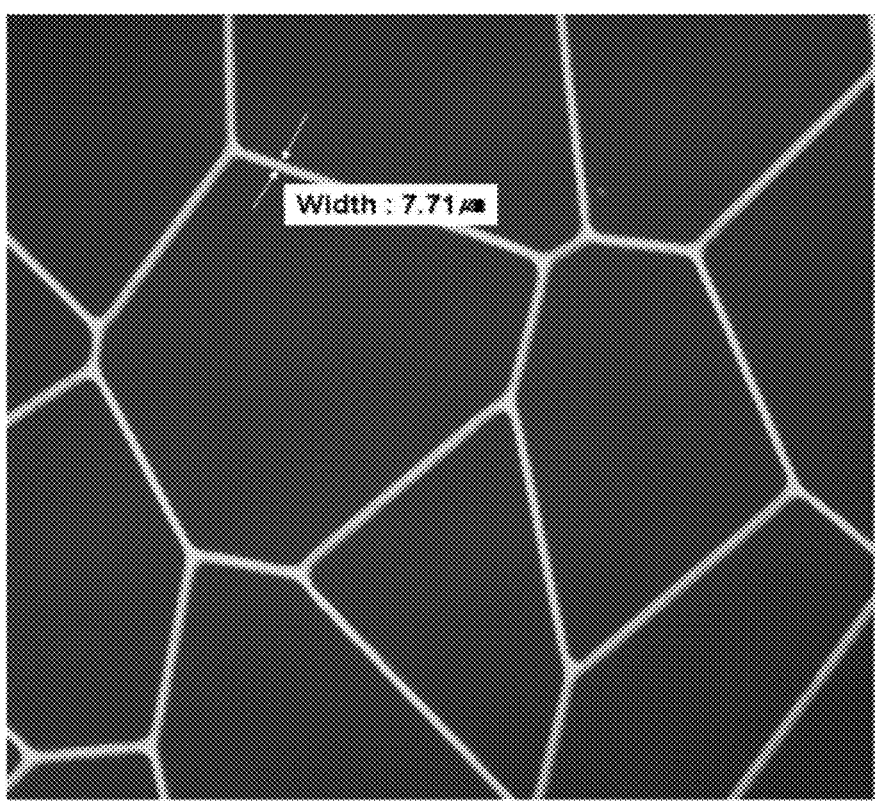
Figures 14, 15:
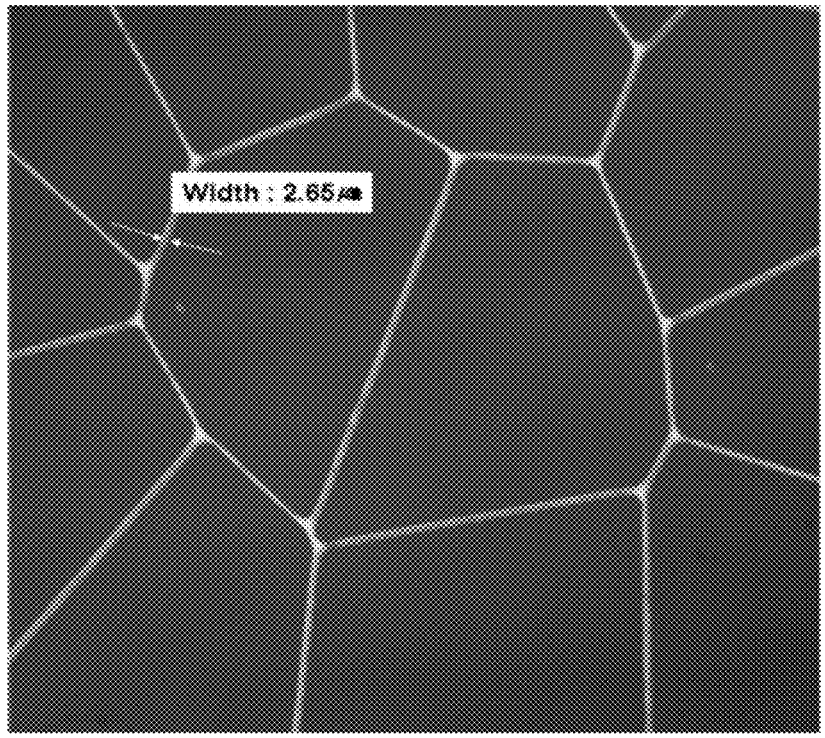
FIG. 15 is a picture before removing the etching resist of the conductive pattern manufactured in Example 6.

Subsequently, the etching (just etching time 30 sec) was performed for about 110 sec at 40° C. by using the Cu etchant (ELCE-100) manufactured by ENF Co., Ltd. (Korea). Subsequently, the etching resist ink of the Bouronoi pattern was removed. Thereby, the manufactured conductive pattern was the same as that of FIG. 12, and the line width of the conductive pattern was 2.65 micrometers. The picture before the etching resist ink is removed is illustrated in FIG. 13, and the picture of the conductive pattern after the etching resist ink is removed is illustrated in FIG. 14.

Examples 2 to 7

The conductive film was etched under the conditions of the just-etching time (30 sec) (Example 2), 1.3 times the just-etching time (Example 3), 1.5 times the just-etching time (Example 4), 2 times the just-etching time (Example 5), 3 times the just-etching time (Example 6), and 5 times the just-etching time (Example 7), respectively. When the film was etched 3 times the just-etching time (Example 6), the line width was 6.05 micrometers, and at this time, the picture is illustrated in FIG. 15.

Figure 16:
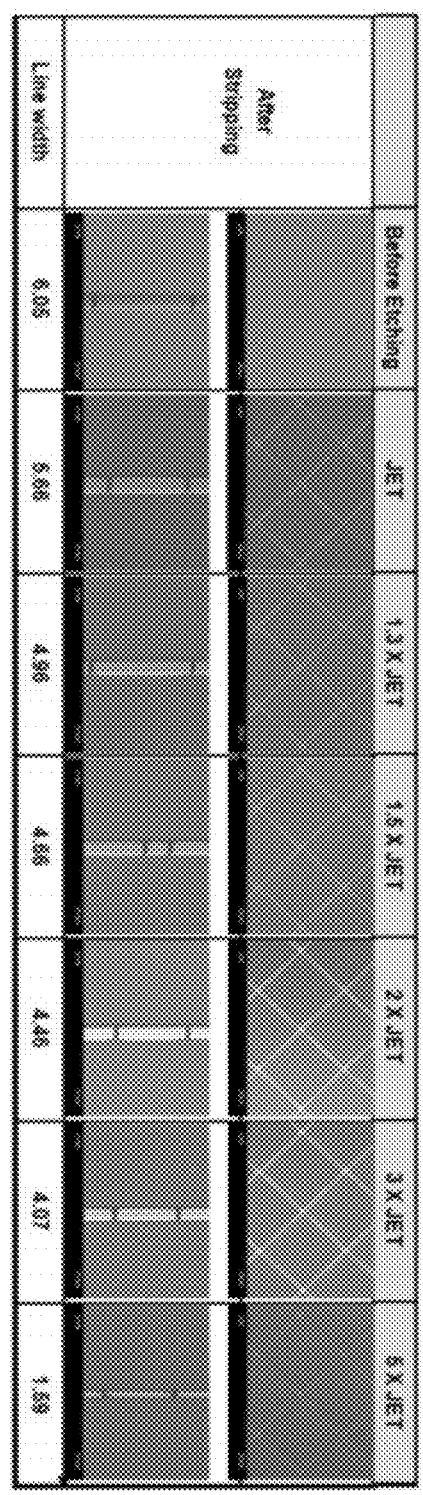
FIG. 16 is a picture that illustrates the conductive pattern manufactured in Examples 2 to 7.

Subsequently, the etching resist ink of the Bouronoi pattern was removed. The picture in which the etching resist ink is removed is illustrated in FIG. 16. The line width of each Example is described below.

TABLE 1

|  | Before etching resist is removed | After etching resist is removed | | | | | |
|---|---|---|---|---|---|---|---|
|  |  | Example 2 | Example 3 | Example 4 | Example 5 | Example 6 | Example 7 |
| Line width (micrometer) | 6.05 | 5.66 | 4.96 | 4.66 | 4.46 | 4.07 | 1.59 |

Example 8

The glass substrate was manufactured by depositing the Ni metal on 0.5 t glass in the thickness of 20 nm, Ag thereon in the thickness of 200 nm, and Ni thereon in the thickness of 20 nm by the sputtering process.

Thereafter, the UV curable ink (LGP-7 manufactured by Natoco, Co., Ltd. (Japan)) was printed by using the cliché having the size of line width 8 microns/pitch 200 microns and the Bouronoi irregular pattern by using the gravure offset printing.

Figure 17:
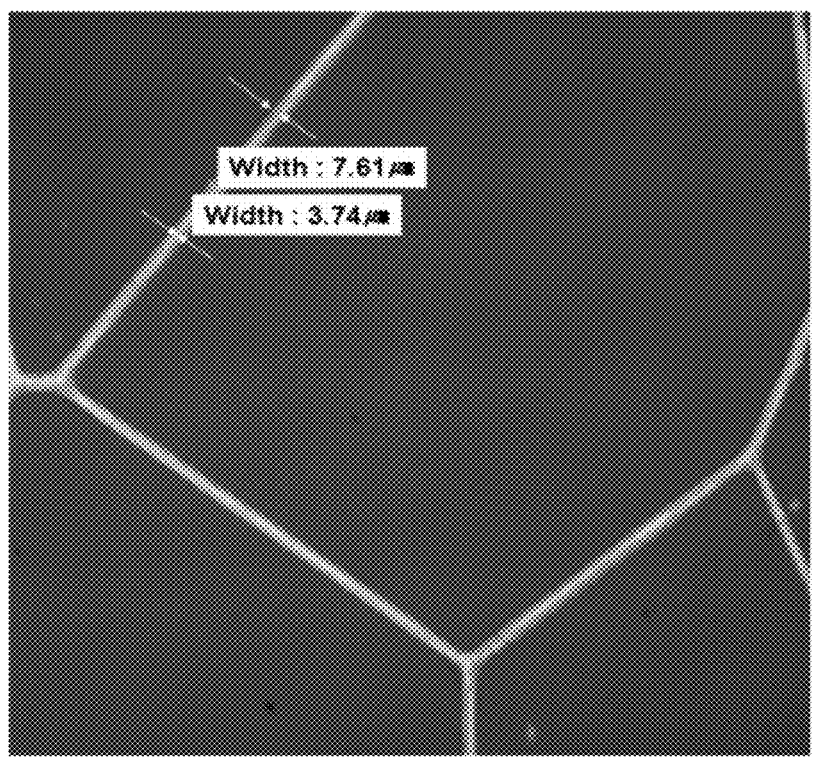
FIG. 17 is a picture that illustrates the conductive pattern manufactured in Example 8.

Thereafter, the printed sample was exposed in about 500 mJ/cm$^2$ by the UV curing, and the bake process of the substrate was performed at 130° C. for 30 min. Subsequently, the conductive pattern having the same structure as FIG. 13 was obtained by performing the etching for about 60 sec (just etching time 20 sec) at 40° C. by using the Al etchant (the mixed solution of the phosphoric acid, the nitric acid, the acetic acid, and water) manufactured by Zeus Co., Ltd. (Korea). Since the UV curable ink was transparent, the measurement of the internal line width was feasible, the line width of the conductive pattern was 3.74 micrometers, and the line width of the insulation layer pattern was 7.61 micrometers. The picture of the conductive pattern is illustrated in FIG. 17.

The invention claimed is:

1. A conductive pattern in which a line width is 0.1 micrometers to 100 micrometers, and a surface resistance of the conductive pattern is 1 ohm/square to 200 ohm/square,
   wherein a thickness of the conductive pattern is 100 to 300 nm, and
   the conductive pattern has an opening ratio of 85% to 98%, and satisfies the following Equation 1:

$$a/(1-\text{opening ratio})=A \qquad \text{[Equation 1]}$$

wherein a is a surface resistance of a layer formed of a material constituting the conductive pattern in a thickness of t, and
   A is a surface resistance of the conductive pattern in a thickness of t.

2. The conductive pattern according to claim 1, wherein a line width of the conductive pattern is 0.5 to 10 micrometers.

3. The conductive pattern according to claim 1, wherein the conductive pattern is manufactured by using a method comprising the steps of:
   a) forming a conductive film on a substrate;
   b) forming an etching resist pattern on the conductive film; and
   c) forming a conductive pattern having a smaller line width than a width of the etching resist pattern by over-etching the conductive film by using the etching resist pattern.

4. The conductive pattern according to claim 1, further comprising an etching resist pattern that is disposed on the conductive pattern, has a pattern corresponding to the conductive pattern, and has a longer line width than the line width of the conductive pattern.

5. The conductive pattern according to claim 4, wherein the etching resist pattern has an insulation property.

6. The conductive pattern according to claim 4, wherein in a cross-section of the conductive pattern in a line width direction, a percentage ratio (a/b*100) of a distance (a) from an end of a side of the conductive pattern to an end of the etching resist pattern and a distance (b) from an end of the other side of the conductive pattern to the end of the etching resist pattern is in the range of 90 to 110.

7. The conductive pattern according to claim 1, wherein the conductive pattern satisfies the following Equations 2 and 3:

$$a/[1-(R-L)^2/R^2]=A \qquad \text{[Equation 2]}$$

$$(R-L)^2/R^2 \times Ts = Tc \qquad \text{[Equation 3]}$$

wherein
R is a pitch of the conductive pattern,
L is a line width of the conductive pattern,
a is a surface resistance of a layer formed of a material constituting the conductive pattern in a thickness of t,
A is a surface resistance of the conductive pattern in a thickness of t, Ts is a transmittance of the substrate, and Tc is a transmittance of the substrate having the conductive pattern.

8. The conductive pattern according to claim 1, wherein a thickness deviation of the conductive pattern according to a position is 0 or more and within 3%.

9. The conductive pattern according to claim 1, wherein a line width deviation of the conductive pattern according to a position is 0 or more and within 30%.

10. The conductive pattern according to claim 1, wherein the conductive pattern has a pattern shape continuously formed in an area in which a diagonal length of a rectangle is 7 inch or more.

* * * * *